United States Patent
Khanna et al.

(10) Patent No.: US 11,393,971 B2
(45) Date of Patent: Jul. 19, 2022

(54) DIFFERENTIAL SENSOR USING THIN-FILM PIEZOELECTRIC CAPACITORS

(71) Applicant: Texas Instruments Incorporated, Dallas, TX (US)

(72) Inventors: Sudhanshu Khanna, Plano, TX (US); Michael Zwerg, Dallas, TX (US); Steven C. Bartling, Dallas, TX (US); Brian Elies, Plano, TX (US); Krishnasawamy Nagaraj, Plano, TX (US); Wei-Yan Shih, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 415 days.

(21) Appl. No.: 16/201,808

(22) Filed: Nov. 27, 2018

(65) Prior Publication Data

US 2020/0168786 A1 May 28, 2020

(51) Int. Cl.
*H01L 41/04* (2006.01)
*H01L 41/08* (2006.01)
*H01L 41/047* (2006.01)
*H01L 41/107* (2006.01)

(52) U.S. Cl.
CPC ........ *H01L 41/0805* (2013.01); *H01L 41/042* (2013.01); *H01L 41/047* (2013.01); *H01L 41/107* (2013.01)

(58) Field of Classification Search
CPC . H01L 41/0805; H01L 41/042; H01L 41/047; H01L 41/107
See application file for complete search history.

(56) References Cited

U.S. PATENT DOCUMENTS

| | | | | |
|---|---|---|---|---|
| 2004/0046484 A1* | 3/2004 | Schiller | ................. | H01L 41/042 310/317 |
| 2010/0117485 A1* | 5/2010 | Martin | ..................... | H04R 3/00 310/319 |
| 2013/0265183 A1* | 10/2013 | Kleks | ..................... | H03M 3/34 341/143 |

\* cited by examiner

*Primary Examiner* — Derek J Rosenau
(74) *Attorney, Agent, or Firm* — Brian D. Graham; Charles A. Brill; Frank D. Cimino (57) ABSTRACT

An improved differential sensor and corresponding apparatus implementing same. The differential sensor includes a substrate, an amplifier coupled to the substrate, and a plurality of highly-matched piezoelectric capacitors formed onto the substrate. A first set of the highly-matched piezoelectric capacitors are electrically coupled to a non-inverting input of the amplifier, and a second set of the highly-matched piezoelectric capacitors are electrically coupled to an inverting input of the amplifier to form an open loop differential amplifier.

20 Claims, 4 Drawing Sheets

DIFFERENTIAL SENSOR USING THIN-FILM PIEZOELECTRIC CAPACITORS

BACKGROUND

Technical Field

Novel aspects of the present disclosure relate to electronic circuits, and more particularly an improved differential sensor utilizing thin-film piezoelectric capacitors that can be used to detect motion via dual strain signals.

Background

Piezoelectricity is an electrical charge that accumulates within a material in response to mechanical stress. Some naturally-occurring crystals exhibit piezoelectricity, such as quartz and topaz. Similarly, man-made ceramics can also exhibit piezoelectricity, including barium titanate, lead titanate, and lead zirconate titanate. When piezoelectric materials are integrated into circuit elements, such as capacitors, the electrical charges generated in the presence of mechanical stress can be harnessed to create sensors.

SUMMARY OF THE INVENTION

Novel aspects of the present invention are directed to a differential sensor comprising a substrate; an amplifier coupled to the substrate; and a plurality of highly-matched piezoelectric capacitors formed onto the substrate. A first set of the plurality of highly-matched piezoelectric capacitors are electrically coupled to a non-inverting input of the amplifier, and a second set of the plurality of highly-matched piezoelectric capacitors are electrically coupled to an inverting input of the amplifier to form an open loop differential amplifier.

In another embodiment, novel aspects of the present invention are directed to an apparatus that comprises a differential sensor that includes a substrate, an amplifier coupled to the substrate, and a plurality of highly-matched piezoelectric capacitors formed on the substrate. A first set of the plurality of highly-matched piezoelectric capacitors are electrically coupled to a non-inverting input of the amplifier, and a second set of the plurality of highly-matched piezoelectric capacitors are electrically coupled to an inverting input of the amplifier to form an open loop differential amplifier. A comparator unit is coupled to an output of the open loop differential amplifier and generates an output signal relating to a state of motion of the apparatus.

Other aspects, embodiments and features of the invention will become apparent from the following detailed description of the invention when considered in conjunction with the accompanying figures. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention.

BRIEF DESCRIPTION OF THE FIGURES

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying figures, wherein:

DETAILED DESCRIPTION

Figure 1A:
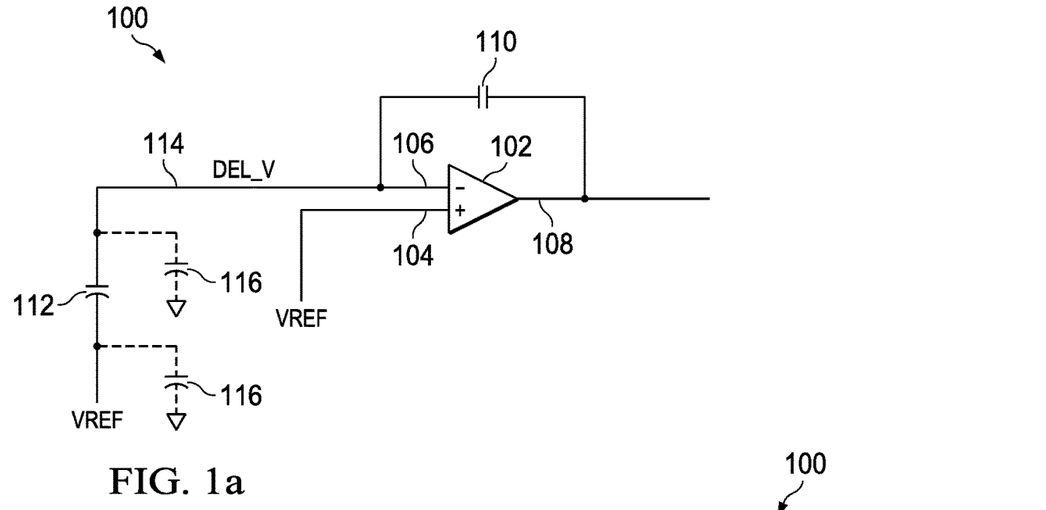
FIG. 1a is a schematic diagram of a prior art piezoelectric sensor.
Figure 1B:
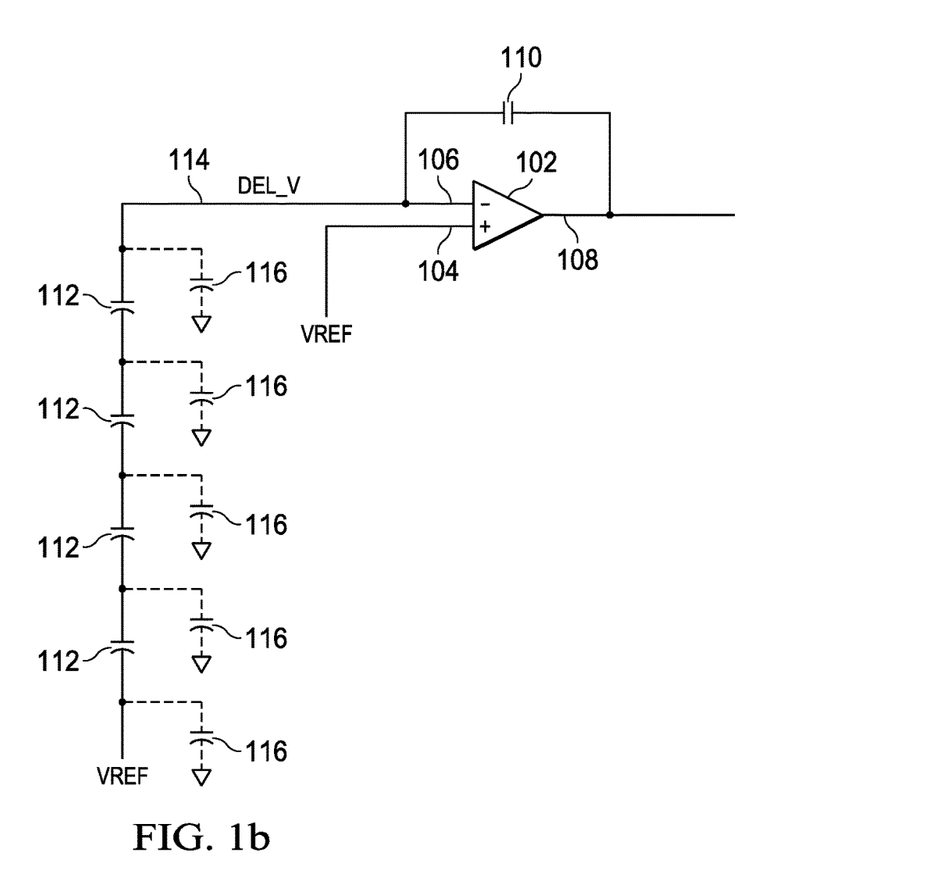
FIG. 1b is a schematic diagram of an exemplary prior art piezoelectric sensor.

The ability for piezoelectric capacitors to generate a signal in the presence of mechanical stress allows for the creation of sensors that can detect motion. An example of prior art motion sensors implementing piezoelectric capacitors is depicted in FIGS. 1a and 1b, which will be discussed in more detail below. These prior art motion sensors include a plurality of discrete piezoelectric capacitors arranged in series and connected to an amplifier in a single-ended configuration, i.e., to a single input of the amplifier. Motion causes deformation of the piezoelectric material in each of the discrete piezoelectric capacitors, which generates a signal that is received by the amplifier. A sufficiently high signal (e.g., exceeds some threshold voltage) can be interpreted as motion.

These prior art motion sensors implementing piezoelectric capacitors, referred to in the alternative as piezoelectric sensors, have been constrained to single-ended topologies due to the inability to manufacture highly-matched circuit elements, such as piezoelectric capacitors. As used herein, the term "highly-matched," when applied to piezoelectric capacitors means capacitance values that vary from one another by less than 1%, or in a more particular embodiment by less than 0.5%, and in some embodiments by less than 0.1%. Up until recently, circuit elements have been manufactured as discrete components that are subsequently electrically connected on a substrate to form these prior art piezoelectric sensors. Discretely formed piezoelectric capacitors are circuit elements that are formed individually but by the same process. However, even discretely formed piezoelectric capacitors made by the same process have unavoidable variability due to imprecise manufacturing tolerances. For example, two discretely formed piezoelectric capacitors with the same purported capacitance, may have capacitance values that differ as much as 5-10%.

Accordingly, discretely formed piezoelectric capacitors could not be paired with a differential amplifier because these relatively small variances would be amplified, reducing the reliability and sensitivity of prior art piezoelectric sensors. Examples of conventional piezoelectric sensors are depicted in more detail in FIGS. 1a and 1b.

FIG. 1 is a schematic diagram of a prior art piezoelectric sensor configured with a single-ended topology. The piezoelectric sensor 100 has an amplifier 102 with a non-inverting input 104, an inverting input 106, and an output 108. A feedback loop 110 connects the output 108 with the inverting input 106. Attached to the inverting input 106 of the amplifier 102 is a discretely formed piezoelectric capacitor 112.

Discretely formed piezoelectric capacitor 112 is a polarized capacitor formed by a pair of opposing plates separated by a ferroelectric material. In a non-limiting embodiment, the ferroelectric material can take the form of any conventional ferroelectric material, including but not limited to lead titanate, lead zirconate titanate, and lead lanthanum zirconate titanate. One characteristic of ferroelectric materials is the ability to produce an electric charge proportionate to an applied mechanical load. Thus, discretely formed piezoelectric capacitors can be implemented in a motion sensor by exploiting the fact that motion can impart a mechanical load on the ferroelectric material in the discretely formed piezoelectric capacitor, resulting in the generation of a detectable electric charge. A sufficiently high electrical charge can be interpreted as motion.

The prior art piezoelectric sensor 100 is formed by connecting each of the various discrete elements together on a substrate, such as a printed circuit board (PCB). In other words, the amplifier 102 and the discretely formed piezoelectric capacitor 112 are formed separately, then arranged on a PCB and electrically coupled together according to conventional assembly techniques. As previously mentioned, the piezoelectric sensor 100 in FIG. 1a can be used to detect motion when the resultant electrical charge generated by the discretely formed piezoelectric capacitor 112 generates a sufficiently high signal that can be passed to the amplifier 102 as an input signal 114 (DEL_V). In an ideal system where size-constraints are non-existent, the single-ended topology of piezoelectric sensor 100 in FIG. 1 is adequate as a motion sensor. The piezoelectric capacitor 112 can be created with an adequate dimension to provide a sufficiently high input signal 114, and the discrete elements may be shielded sufficiently or placed in such a way to avoid or at least significantly reduce the effect of parasitic capacitance. In non-ideal circuits, size constraints limit the practical size of the discretely formed piezoelectric capacitor 112 as well as the placement/shielding of the capacitors, resulting in the existence of parasitic capacitances that reduce the strength of input signal 114. Single ended topologies also have higher reference and supply noise.

Parasitic capacitance in the piezoelectric sensor 100 is represented by parasitic capacitors 116. In other words, the parasitic capacitors 116 are imaginary circuit elements that model the effect of parasitic capacitance in the piezoelectric sensor 100. In the piezoelectric sensor 100 in FIG. 1, the parasitic capacitors 116 reduce the strength of the input signal 114. To overcome these parasitic effects and the noise floor of the associated amplifier 102, the discretely formed piezoelectric capacitor 112 can be increased in size. However, in many contemporary electronic devices, size constraints may necessitate that the discretely formed piezoelectric capacitor 112 be formed by a plurality of smaller, discretely formed piezoelectric capacitors rather than a single piezoelectric capacitor. However, this solution comes at the expense of increased parasitic capacitances, as can be depicted in FIG. 1b.

FIG. 1b is a schematic diagram of an exemplary prior art piezoelectric sensor 100 formed from a plurality of piezoelectric capacitors 112 arranged in series. As already mentioned, the series of discretely formed piezoelectric capacitors 112 provides an input signal 114 of increased strength, and in a smaller footprint, but at the cost of increased parasitic capacitances. The effect of parasitic capacitances increases superlinearly with increasing numbers of discretely formed piezoelectric capacitors 112 arranged in series. Superlinear parasitic losses, when found in circuits designed for motion sensing, reduces sensitivity.

Accordingly, novel aspects of the illustrative embodiments disclosed herein recognize a need for creating a piezoelectric sensor with a differential topology that reduces the effect of parasitic losses as compared to the single-ended topologies of the prior art. The piezoelectric sensors comprise a plurality of highly-matched, thin-film piezoelectric capacitors that are formed onto the substrate of a semiconductor die. In some embodiments, the thin-film piezoelectric capacitors are formed onto the substrate by conventional means including deposition, etching, and lithography so that all of the piezoelectric capacitors are formed at the same time using the same process or processes to minimize variability. Thus, "highly-matched" capacitors can also refer to capacitors that are formed onto a substrate in the same fabrication process.

Figure 2A:
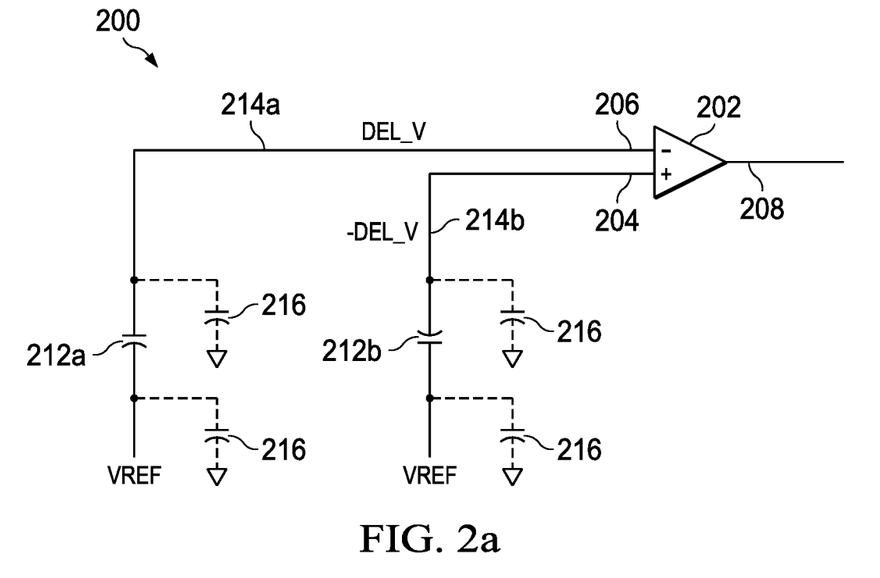
FIG. 2a is a general schematic diagram of a piezoelectric sensor in accordance with an illustrative embodiment.

FIG. 2a is a general schematic diagram of a differential piezoelectric sensor 200 in accordance with an illustrative embodiment. The differential piezoelectric sensor 200 has an amplifier 202 with a non-inverting input 204, an inverting input 206, and an output 208. Attached to each of the inputs 204 and 206 is a highly-matched piezoelectric capacitor. Specifically, highly-matched, thin-film piezoelectric capacitor 212b is connected to non-inverting input 204 of the amplifier 202 and highly-matched, thin-film piezoelectric capacitor 212a is connected to the inverting input 206 of the amplifier 202. The polarity of the piezoelectric capacitor 212b connected to the non-inverting input 204 of the amplifier 202 is opposite to the polarity of the piezoelectric capacitor 212a connected to the inverting input 206, of the amplifier 202. Restated, piezoelectric capacitor 212b is configured with a first polarity and piezoelectric capacitor 212a is configured with a second polarity that is opposite to the first polarity, relative to the amplifier 202. Thus, the input signal 214a provided to the non-inverting input 204 is of the same magnitude but opposite to the input signal 214b provided to the inverting input 206. Additionally, as with the piezoelectric sensor 100 depicted in FIG. 1a, the piezoelectric sensor 200 in FIG. 2a is also affected by parasitic capacitances, which are modeled by parasitic capacitors 216.

The thin-film piezoelectric capacitors 212 are each formed from a pair of conducting elements separated by a ferroelectric material that can generate an electric charge when exposed to a mechanical load. Specifically, the electrical charge generated by piezoelectric capacitor 212a is passed to the amplifier 202 as input signal 214a, but reduced by parasitic capacitances. The electrical charge generated by piezoelectric capacitor 212b is passed to the amplifier 202 as input signal 214b, also reduced by parasitic capacitances. The output signal from the output 208 of the amplifier 202 is the amplified difference between input signal 214a and input signal 214b.

In this illustrative embodiment in FIG. 2a, the piezoelectric capacitor 212a is depicted as a single piezoelectric capacitor. However, in another embodiment, the piezoelectric capacitor 212a can be two or more piezoelectric capacitors arranged in series, parallel, or a combination of series and parallel. Thus, piezoelectric capacitor 212a may be referred to in the alternative as a set of piezoelectric capacitors 212a where the set can be formed of one piezoelectric capacitor or two or more piezoelectric capacitors. Likewise, the piezoelectric capacitor 212b is also a set of piezoelectric capacitors 212b that can include a single piezoelectric capacitor, or a plurality of piezoelectric capacitors, arranged in series, parallel, or a combination of series and parallel. Thus, piezoelectric capacitor 212b may be referred to in the alternative as a set of piezoelectric capacitors 212b where the set can be formed of one piezoelectric capacitor or two or more piezoelectric capacitors.

In one embodiment, the set of piezoelectric capacitors 212a is arranged the same as the set of piezoelectric capacitors 212b, and each piezoelectric capacitor in the set of piezoelectric capacitors 212 are highly-matched with every other capacitor in the set.

Figure 2B:
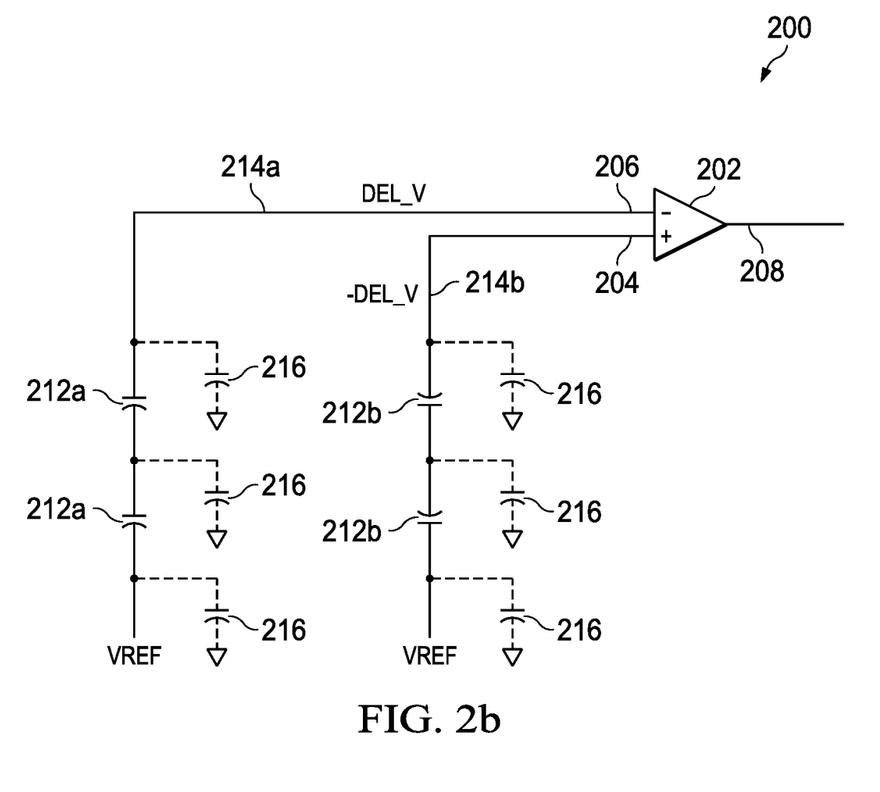
FIG. 2b is a schematic diagram of an exemplary piezoelectric sensor in accordance with an illustrative embodiment.

FIG. 2b is a schematic diagram of an exemplary piezoelectric sensor 200 in accordance with another illustrative embodiment. The piezoelectric sensor 200 in FIG. 2b is offered for comparison with the piezoelectric sensor 100 in FIG. 1b to illustrate some of the differences between the two topologies.

Piezoelectric sensor 200 in FIG. 2b has a set of piezoelectric capacitors 212a that is formed from two separate piezoelectric capacitors. Likewise, the set of piezoelectric capacitors 212b is formed from two separate piezoelectric capacitors. The set of piezoelectric capacitors 212a is arranged to provide an opposite polarity than the set of piezoelectric capacitors 212b.

The open-loop, differential sensor topology of piezoelectric sensor 200 in FIGS. 2a and 2b provided some benefits, such as higher power supply noise rejection and common mode noise rejection. However, the improved piezoelectric sensor 200 also provided a reduction in parasitic capacitance, as discussed in more detail with respect to FIG. 3.

Figure 3:
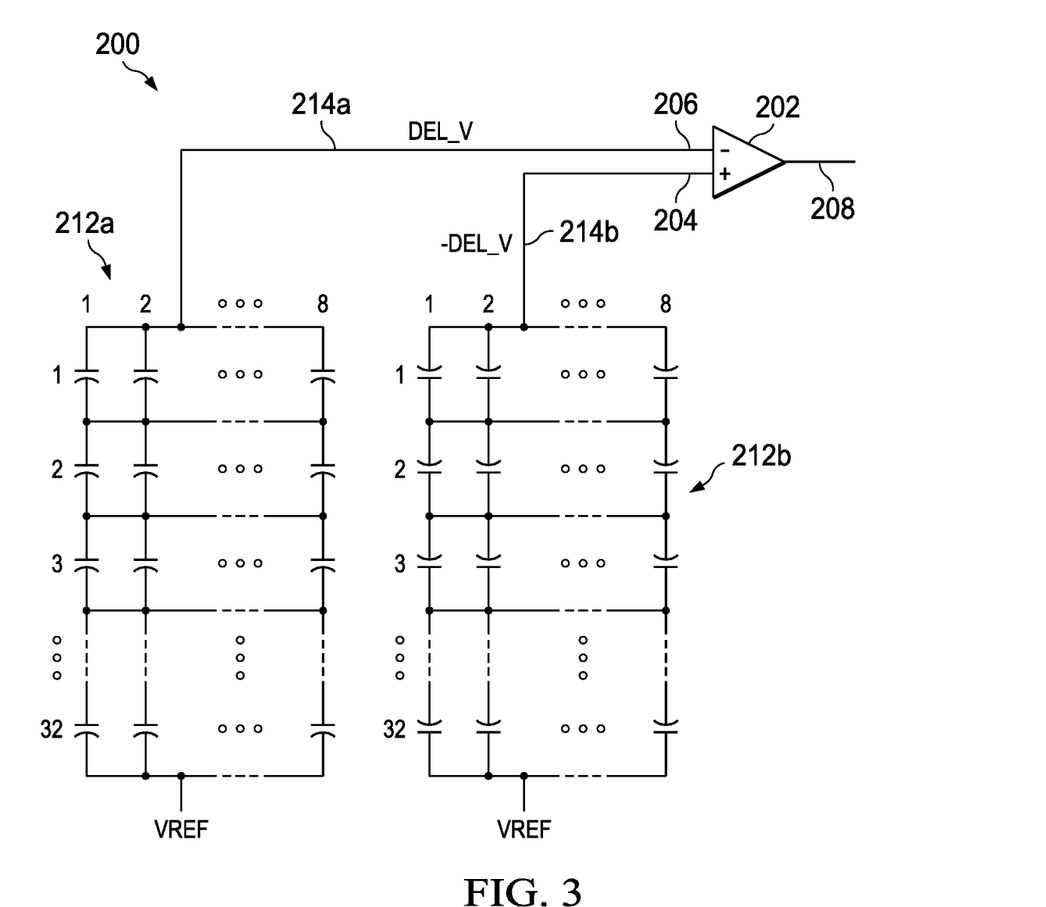
FIG. 3 is a schematic diagram of another exemplary piezoelectric sensor in accordance with an illustrative embodiment.

FIG. 3 is a schematic diagram of another exemplary piezoelectric sensor 200 in accordance with an illustrative embodiment. The piezoelectric sensor 200 is formed from an amplifier 202 with a set of piezoelectric capacitors 212a arranged in an array of 32×8 with a first polarization that provides an input signal 214a (DEL_V) to the inverting input 206. Another set of piezoelectric capacitors 212b is arranged in an array of 32×8 with a second polarization that provides an input signal 214b (DEL_V) to the non-inverting input 204. The set of piezoelectric capacitors 212b provides a signal with an opposite polarity than the set of piezoelectric capacitors 212a. Although not shown, the piezoelectric sensor 200 shown in FIG. 3 is also affected by parasitic capacitance that reduces the effective signal strength of input signals 214a and 214b. However, the signal loss attributable to the parasitic capacitances is less than the single-ended topology formed from the same number of capacitors, arranged in a 64×8 array on either input of an amplifier, such as amplifier 202. Actual measurements were taken comparing the differential piezoelectric sensor 200 shown in FIG. 3 and a corresponding single-ended piezoelectric sensor with one 64×8 array on one of the inputs. The normalized results are provided in Table 1 below.

TABLE 1

Comparison of Differential piezoelectric Sensor vs. Single-ended piezoelectric Sensor

| Parameter | Differential Piezoelectric Sensor | Single-ended Piezoelectic Sensor |
|---|---|---|
| Capacitor Configuration | Two stacks of 32 × 8, one stack per amplifier input | Single stack of 64 × 8 attached to one amplifier input |
| Capacitor Area (normalized) | X μm | X μm |
| Signal without parasitic capacitance (normalized) | Y μV | Y μV |
| Signal with parasitic capacitance (normalized) | 0.86Y μV | 0.63& μV |
| Signal Loss | 14% | 37% |
| Common mode rejection | High | Low |
| Power supply rejection | High | Low |

As can be seen, both the differential piezoelectric sensor and the single-ended piezoelectric sensor have a total of 512 piezoelectric capacitors, but with different configurations. Additionally, the plurality of piezoelectric capacitors in each sensor occupy the same area on their respective semiconductor dies, and generate the same ideal signal in the absence of parasitic capacitances. However, when parasitic capacitances are taken into consideration the resultant signal generated by the differential piezoelectric sensor suffers 14% loss. The signal generated by the single-ended piezoelectric sensor suffers 37% loss.

Figure 4:
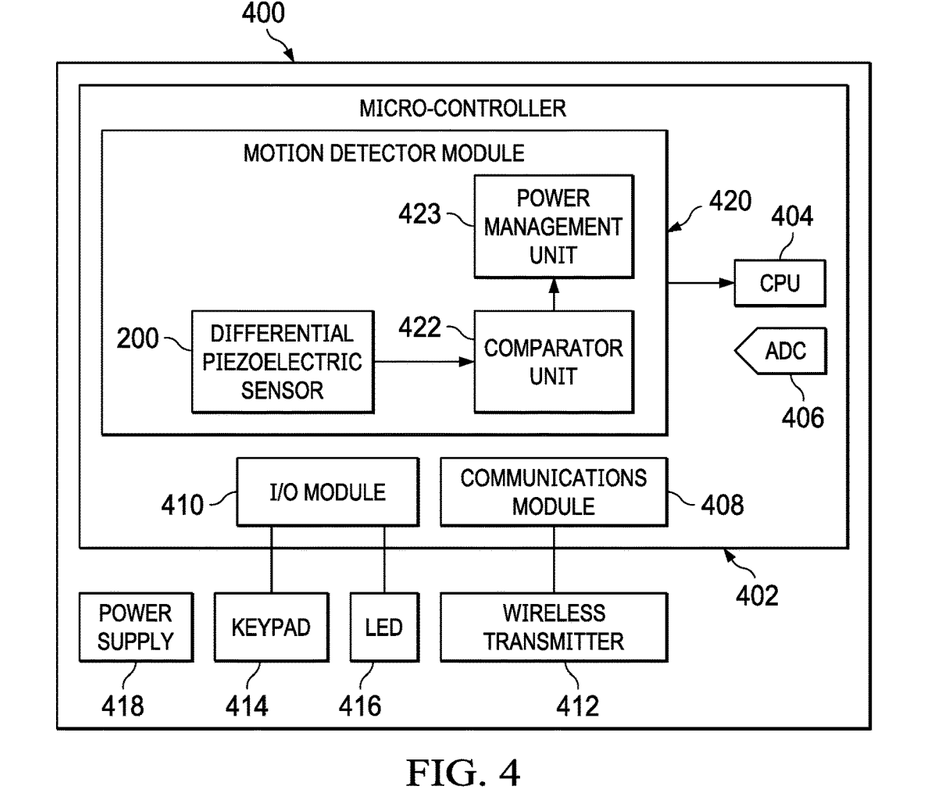
FIG. 4 is a schematic of an apparatus implementing the piezoelectric sensor in accordance with an illustrative embodiment.

FIG. 4 is a schematic of an apparatus implementing the novel piezoelectric sensor in accordance with an illustrative embodiment. The apparatus 400 includes a microcontroller 402 that provides motion sensing capabilities as well as power management based upon a state of motion of the apparatus 400. Non-limiting examples of the apparatus 400 can include remote controls, such as television remotes, that are frequently left unused. Battery life of the apparatus 400 can be preserved by only powering the apparatus 400 in response to sensed motion. For example, when the apparatus 400 is in the active motion state, the apparatus 400 may be fully powered so that all electrical components and/or systems are operational, but in the inactive motion state, the apparatus 400 may be in a reduced power state. In one non-limiting example, in the reduced power state, one or more of a CPU, ADC, I/O module, communications module, keypad, LED, or wireless transmitter may be unpowered, as explained in more detail below.

Returning to FIG. 4, the exemplary microcontroller 402 includes motion detection module 420, which is formed from a comparator unit 422 connected to the output 208 of the open loop differential amplifier 202 of the differential piezoelectric sensor 200. Comparator unit 422 is a circuit element that receives the output signal from the differential piezoelectric sensor 200 for comparison with a reference signal to determine the state of motion of the apparatus 400. The reference signal can be determined based on prior controlled experiments. A signal from output 208 of the differential piezoelectric sensor 200 which fails to exceed the reference signal can be associated with an inactive motion state, and a signal from output 208 that exceeds the reference signal voltage can be associated with an active motion state. As a result, power distribution can be selectively distributed based on the state of motion of the apparatus 400.

Power can be selectively distributed by power management unit 423 to one or more electrical elements on the semiconductor die of the microcontroller 402, such as central processing unit (CPU) 404, analog-to-digital converter (ADC) 406, communications module 408, and/or input/output (I/O) module 410. CPU 404 can take the form of any number of conventional processors including but not limited to a microprocessor, a microcontroller, a general-purpose processor, a graphics processing unit, a digital signal processor, an application-specific integrated circuit, a general-purpose integrated circuit, or combinations thereof. ADC 406 is one or more analog-to-digital converters configured to convert an analog signal to a digital signal that can be stored and/or processed by the microcontroller 402. Withholding power to one or more of the electrical elements of the microcontroller 402 in the absence of motion preserves battery life.

In this illustrative embodiment, the communications module 408 is electrically connected to a wireless transmitter 412, and the general-purpose I/O 410 is connected with a keypad 414 and LED 416. Power is supplied to the microcontroller 402 by power supply 418 and selectively distributed to components of the apparatus 400, such as the keypad 414, the LED 416, and the wireless transmitter 412 via the microcontroller 402 based on a state of motion of the apparatus 400.

For example, a signal that indicates the apparatus 400 is in the inactive motion state can result in the apparatus 400 entering a power-saving mode in which power distribution from the microcontroller 402 has been restricted. In some embodiments, the power saving-mode involves restricting power distribution to the wireless transmitter 412 via the communications module 408, and/or to the keypad 414 and the LED 416 via the general-purpose I/O 410. In another embodiment, the power-saving mode may also restrict power supplied to the CPU 404, as well as the ADC 406.

The embodiment depicted in FIG. 4 should be deemed exemplary and non-limiting. For example, the comparator unit 422 may be implemented by conventionally available circuitry, and in a non-limiting embodiment the comparator unit 422 is an op amp. In some embodiments, all the components of the microcontroller 402 are formed on the same semiconductor die using conventional fabrication processes including, but not limited to etching, deposition, photoresist, or combinations thereof. In another embodiment, the motion detector module 420 is formed on a separate semiconductor die and mounted onto the microcontroller 402.

Motion sensing capabilities provided via the differential piezoelectric sensor 200 as described herein provide high sensitivity, low noise, and low power consumption. In addition, the differential piezoelectric sensor 200 also provides decreased parasitic signal loss, which is manifested as higher input signals into the amplifier 202.

Figure 5:
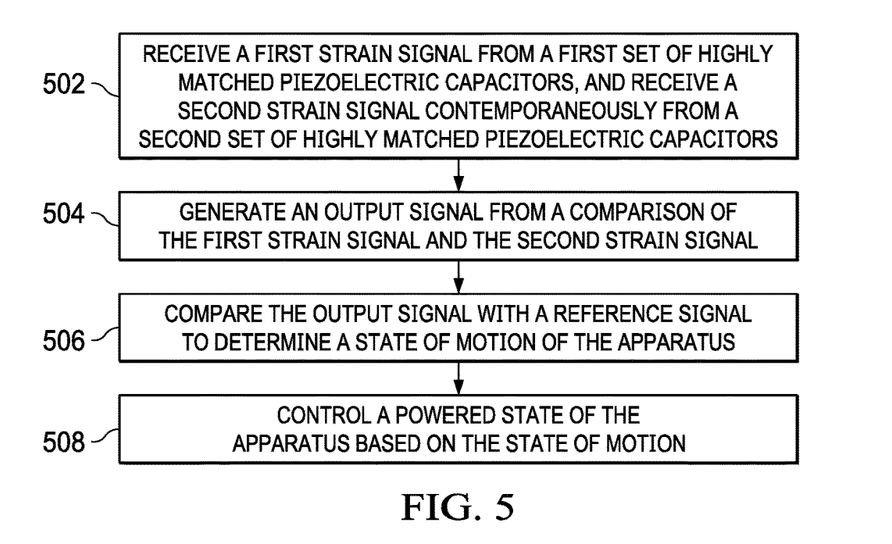
FIG. 5 is a flowchart of a process for detecting motion using a differential piezoelectric sensor in accordance with an illustrative embodiment.

FIG. 5 is a flowchart of a process for detecting motion using a differential piezoelectric sensor 200 in accordance with an illustrative embodiment. The process can be implemented in a differential piezoelectric sensor, such as differential sensor 200 in FIG. 2. In certain embodiments where the differential piezoelectric sensor is incorporated into an apparatus powered by a portable power source, the process described in FIG. 5 can reduce power consumption and preserve battery life by maintaining the apparatus 400 in a low-power state until motion is detected.

In a first step, a first strain signal is received from a first set of highly-matched piezoelectric capacitors, and a second strain signal is received contemporaneously from a second set of highly-matched piezoelectric capacitors (Step 502). An output signal is generated from a comparison of the first strain signal and the second strain signal (Step 504). In a non-limiting embodiment, the comparison is performed by an amplifier, such as amplifier 202.

The output signal is compared with a reference signal to determine a state of motion of the apparatus (Step 506). The reference signal is a pre-determined threshold voltage that is selected based on the desired sensitivity of the piezoelectric motion sensor. Highly sensitive piezoelectric motion sensors may have a lower reference signal whereas less sensitive piezoelectric motion sensors may have a higher reference signal. Further, in one non-limiting embodiment, only two states of motion are contemplated: an active state of motion or an inactive state of motion. In other embodiments, more than two states of motion may be established based upon the magnitude and/or duration of motion. For example, motion that lasts for a short duration may be unrelated to intended use and can be categorized as quasi-motion state associated with a predetermined power distribution setting.

Thereafter, a powered state of the apparatus is controlled based on the state of motion of the apparatus (Step 508). For example, when the apparatus is deemed to be in the inactive state, power can be withheld from one or more electrical components to extend battery life. Depending upon the particular implementation, power can be withheld from any number of components including a CPU, an ADC, a wireless transmitter, input/output devices, or combinations thereof. Likewise, depending upon the particular implementation, when the apparatus is deemed to be in the active state, power can be (re)supplied to the aforementioned components including the CPU, the ADC, the wireless transmitter, the input/output devices, or combinations thereof.

Additional Embodiments

The following descriptive embodiments are offered in further support of the disclosed invention:

In a first embodiment, novel aspects of the present disclosure are directed to a differential sensor comprising: a substrate; an amplifier coupled to the substrate; and a plurality of highly-matched piezoelectric capacitors formed onto the substrate, wherein a first set of the highly-matched piezoelectric capacitors are electrically coupled to a non-inverting input of the amplifier, and wherein a second set of the highly-matched piezoelectric capacitors are electrically coupled to an inverting input of the amplifier to form an open loop differential amplifier.

In another aspect of the first embodiment, the differential sensor comprises: a substrate; an amplifier coupled to the substrate; and a plurality of highly-matched piezoelectric capacitors formed onto the substrate, wherein a first set of the highly-matched piezoelectric capacitors are electrically coupled to a non-inverting input of the amplifier, and wherein a second set of the highly-matched piezoelectric capacitors are electrically coupled to an inverting input of the amplifier to form an open loop differential amplifier, the differential sensor further comprising one or more limitations selected from the following list:

wherein each of the plurality of highly-matched piezoelectric capacitors are polarized capacitors;

wherein the first set of the highly-matched piezoelectric capacitors is configured with a first polarity, wherein the second set of the highly-matched piezoelectric capacitors is configured with a second polarity that is opposite to the first polarity;

wherein the first set of the highly-matched piezoelectric capacitors comprises one or more capacitors in series, and wherein the second set of highly-matched piezoelectric capacitors comprises one or more capacitors in series;

wherein the first set of the highly-matched piezoelectric capacitors comprises one or more capacitors in parallel, and wherein the second set of highly-matched piezoelectric capacitors comprises one or more capacitors in parallel;

wherein the first set of the highly-matched piezoelectric capacitors comprises one or more capacitors in series and in parallel, and wherein the second set of highly-matched piezoelectric capacitors comprises one or more capacitors in series and in parallel;

wherein the first set of highly-matched piezoelectric capacitors is arranged in a first 32×8 array, and wherein the second set of highly-matched piezoelectric capacitors is arranged in a second 32×8 array;

wherein the differential sensor further comprises a comparator unit coupled an output of the open loop differential amplifier, wherein the comparator unit is configured to determine a state of motion; and wherein the differential sensor further comprises a power management unit coupled to the comparator unit, wherein the power management unit is configured to selectively distribute power to components on a semiconductor die housing the differential sensor.

In a second embodiment, novel aspects of the present disclosure are directed to an apparatus comprising: a differential sensor that comprises a substrate, an amplifier coupled to the substrate, and a plurality of highly-matched piezoelectric capacitors formed onto the substrate, wherein a first set of the highly-matched piezoelectric capacitors are electrically coupled to a non-inverting input of the amplifier, and wherein a second set of the highly-matched piezoelectric capacitors are electrically coupled to an inverting input of the amplifier to form an open loop differential amplifier; and a comparator unit coupled to an output of the open loop differential amplifier, wherein the comparator unit generates an output signal relating to a state of motion of the apparatus.

In another aspect of the second embodiment, novel aspects of the present disclosure are directed to an apparatus comprising: a differential sensor that comprises a substrate, an amplifier coupled to the substrate, and a plurality of highly-matched piezoelectric capacitors formed onto the substrate, wherein a first set of the highly-matched piezoelectric capacitors are electrically coupled to a non-inverting input of the amplifier, and wherein a second set of the highly-matched piezoelectric capacitors are electrically coupled to an inverting input of the amplifier to form an open loop differential amplifier; and a comparator unit coupled to an output of the open loop differential amplifier, wherein the comparator unit generates an output signal relating to a state of motion of the apparatus, the apparatus further comprising one or more limitations selected from the following list:

wherein each of the plurality of highly-matched piezoelectric capacitors are polarized capacitors;

wherein the first set of the highly-matched piezoelectric capacitors is configured with a first polarity, wherein the second set of the highly-matched piezoelectric capacitors is configured with a second polarity that is opposite to the first polarity;

wherein the first set of the highly-matched piezoelectric capacitors comprises one or more capacitors in series, wherein the second set of the highly-matched piezoelectric capacitors is configured with a second polarity that is opposite to the first polarity;

wherein the first set of the highly-matched piezoelectric capacitors comprises one or more capacitors in parallel, and wherein the second set of highly-matched piezoelectric capacitors comprises one or more capacitors in parallel;

wherein the first set of the highly-matched piezoelectric capacitors comprises one or more capacitors in series and in parallel, and wherein the second set of highly-matched piezoelectric capacitors comprises one or more capacitors in series and in parallel;

wherein the first set of highly-matched piezoelectric capacitors is arranged in a first 32×8 array, and wherein the second set of highly-matched piezoelectric capacitors is arranged in a second 32×8 array;

wherein the apparatus further comprises: a semiconductor die housing the differential sensor, and a power management unit coupled to the comparator unit, wherein the power management unit is configured to selectively distribute power to components on the semiconductor die;

wherein the components on the semiconductor die comprise one or more of a central processing unit, an analog-to-digital converter, a communications module, and an input/output module;

wherein the apparatus further comprises at least one of a keypad and a wireless transmitter, wherein the keypad is communicatively coupled to the input/output module, and wherein the wireless transmitter is communicatively coupled to the communications module.

Although embodiments of the invention have been described with reference to several elements, any element described in the embodiments described herein are exemplary and can be omitted, substituted, added, combined, or rearranged as applicable to form new embodiments. A skilled person, upon reading the present specification, would recognize that such additional embodiments are effectively disclosed herein. For example, where this disclosure describes characteristics, structure, size, shape, arrangement, or composition for an element or process for making or using an element or combination of elements, the characteristics, structure, size, shape, arrangement, or composition can also be incorporated into any other element or combination of elements, or process for making or using an element or combination of elements described herein to provide additional embodiments.

Additionally, where an embodiment is described herein as comprising some element or group of elements, additional embodiments can consist essentially of or consist of the element or group of elements. Also, although the open-ended term "comprises" is generally used herein, additional embodiments can be formed by substituting the terms "consisting essentially of" or "consisting of."

While this invention has been particularly shown and described with reference to preferred embodiments, it will be understood by those skilled in the art that various changes in form and detail may be made therein without departing from the spirit and scope of the invention. The inventors expect skilled artisans to employ such variations as appropriate, and the inventors intend the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A differential sensor comprising:
a substrate;
a plurality of piezoelectric capacitors disposed on the substrate, wherein the plurality of piezoelectric capacitors have substantially similar capacitances; and
an amplifier that includes an inverting input and a non-inverting input, wherein a first set of the piezoelectric capacitors are electrically coupled to the non-inverting input of the amplifier, and wherein a second set of the piezoelectric capacitors are electrically coupled to the inverting input of the amplifier.

2. The differential sensor of claim 1, wherein each of the plurality of piezoelectric capacitors is a polarized capacitor.

3. The differential sensor of claim 2, wherein the first set of the piezoelectric capacitors is coupled to the non-inverting input aligned in a first polarity, wherein the second set of the piezoelectric capacitors is coupled to the inverting input aligned in a second polarity that is opposite to the first polarity.

4. The differential sensor of claim 1, wherein the first set of the piezoelectric capacitors comprises capacitors coupled in series, and wherein the second set of the piezoelectric capacitors comprises one capacitors coupled in series.

5. The differential sensor of claim 1, wherein the first set of the piezoelectric capacitors comprises capacitors coupled in parallel, and wherein the second set of the piezoelectric capacitors comprises capacitors coupled in parallel.

6. The differential sensor of claim 1, wherein the first set of the piezoelectric capacitors comprises capacitors coupled in series and in parallel, and wherein the second set of the piezoelectric capacitors comprises capacitors coupled in series and in parallel.

7. The differential sensor of claim 1, wherein the first set of the piezoelectric capacitors is arranged in a first 32×8 array, and wherein the second set of the piezoelectric capacitors is arranged in a second 32×8 array.

8. The differential sensor of claim 1, wherein:
the amplifier further includes an output;
the differential sensor further comprises: a comparator unit coupled to the output of the amplifier; and
the comparator unit is configured to determine a state of motion.

9. The differential sensor of claim 8, further comprising:
a power management unit coupled to the comparator unit, wherein the power management unit is configured to selectively distribute power to a set of components.

10. An apparatus comprising:
a differential sensor that includes:
a substrate;
an amplifier coupled to the substrate that includes a non-inverting input, an inverting input, and an output; and
a plurality of piezoelectric capacitors disposed on the substrate, wherein:
the plurality of piezoelectric capacitors have substantially similar capacitances;
a first set of the piezoelectric capacitors are electrically coupled to the non-inverting input of the amplifier; and
a second set of the piezoelectric capacitors are electrically coupled to the inverting input of the amplifier; and a comparator unit coupled to the output of the amplifier, wherein the comparator unit is configured to generate an output signal relating to a state of motion of the apparatus.

11. The apparatus of claim 10, wherein each of the plurality of piezoelectric capacitors is a polarized capacitor.

12. The apparatus of claim 11, wherein the first set of the piezoelectric capacitors is coupled in a first polarity, wherein the second set of the piezoelectric capacitors is coupled in a second polarity that is opposite to the first polarity.

13. The apparatus of claim 10, wherein the first set of the piezoelectric capacitors comprises capacitors coupled in series, wherein the second set of the piezoelectric capacitors comprises capacitors coupled in series.

14. The apparatus of claim 10, wherein the first set of the piezoelectric capacitors comprises capacitors coupled in parallel, and wherein the second set of the piezoelectric capacitors comprises capacitors coupled in parallel.

15. The apparatus of claim 10, wherein the first set of the piezoelectric capacitors comprises capacitors coupled in series and in parallel, and wherein the second set of the piezoelectric capacitors comprises capacitors coupled in series and in parallel.

16. The apparatus of claim 10, wherein the first set of the piezoelectric capacitors is arranged in a first 32×8 array, and wherein the second set of the piezoelectric capacitors is arranged in a second 32×8 array.

17. The apparatus of claim 10, further comprising:
a semiconductor die that includes the differential sensor and a set of components; and
a power management unit coupled to the comparator unit, wherein the power management unit is configured to selectively distribute power to the set of components.

18. The apparatus of claim 17, wherein the set of components include one or more of a central processing unit, an analog-to-digital converter, a communications module, or an input/output module.

19. The apparatus of claim 18, further comprising at least one of a keypad or a wireless transmitter, wherein the keypad is communicatively coupled to the input/output module, and wherein the wireless transmitter is communicatively coupled to the communications module.

20. An integrated circuit device comprising:
an amplifier that includes an inverting input, a non-inverting input, and an output, wherein the amplifier is coupled in an open-loop configuration;
a first set of capacitors coupled to the inverting input of the amplifier;
a second set of capacitors coupled to the non-inverting input of the amplifier; and
a comparator circuit coupled to the output of the amplifier and configured to compare the output of the amplifier to a predetermined reference signal to determine a state of motion.

* * * * *